(12) United States Patent
Lee et al.

(10) Patent No.: US 9,589,906 B2
(45) Date of Patent: Mar. 7, 2017

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Daesung Lee, Kaohsiung (TW); Ingyu Han, Kaohsiung (TW); Chulhyun Park, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/634,555

(22) Filed: Feb. 27, 2015

(65) Prior Publication Data

US 2016/0254230 A1 Sep. 1, 2016

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/561* (2013.01); *H01L 23/3114* (2013.01); *H01L 23/3121* (2013.01); *H01L 23/49541* (2013.01); *H01L 23/49548* (2013.01); *H01L 24/97* (2013.01); *H01L 24/32* (2013.01);
(Continued)

(58) Field of Classification Search
None
See application file for complete search history.

(56) References Cited

U.S. PATENT DOCUMENTS

| | | | |
|---|---|---|---|
| 7,087,462 B1* | 8/2006 | Park | H01L 21/561 257/666 |
| 7,338,841 B2* | 3/2008 | Lau | H01L 21/565 257/666 |

(Continued)

OTHER PUBLICATIONS

Y.C. How and S.W. Lee, "Reliability Improvement of Array QFN Package," Surface Mount Technology Proceedings, 2013, downloaded from URL<http://www.smta.org/penang/papers/S7_P1_YC_How.pdf> on Feb. 16, 2016.*

(Continued)

*Primary Examiner* — Joseph Schoenholtz
(74) *Attorney, Agent, or Firm* — Foley & Lardner LLP; Cliff Z. Liu

(57) ABSTRACT

The present disclosure relates to a semiconductor device package and a manufacturing method thereof. The semiconductor package comprises a die pad, a row of leads, a component, a package body, and a conformal shield. The die pad has a top surface. The row of leads comprises a first lead and a second lead, and the row of leads is arranged along a side of the die pad. The first lead has a first lateral surface, and the second lead has a second lateral surface. The component is disposed on the top surface of the die pad. The package body encapsulates the component, the die pad, the first lead, and the second lead, exposes the first lateral surface of the first lead, and covers the second lateral surface of the second lead. The conformal shield covers the package body and connects to the first lateral surface of the first lead.

16 Claims, 12 Drawing Sheets

(51) Int. Cl.
  *H01L 23/31*  (2006.01)
  *H01L 23/495*  (2006.01)
  *H01L 23/00*  (2006.01)

(52) U.S. Cl.
  CPC .............. *H01L 24/48* (2013.01); *H01L 24/73* (2013.01); *H01L 24/92* (2013.01); *H01L 2224/32245* (2013.01); *H01L 2224/48091* (2013.01); *H01L 2224/48247* (2013.01); *H01L 2224/73265* (2013.01); *H01L 2224/92247* (2013.01); *H01L 2224/97* (2013.01)

(56) References Cited

U.S. PATENT DOCUMENTS

| | | | | |
|---|---|---|---|---|
| 7,808,084 B1* | 10/2010 | Lee | ................... | H01L 23/49503 257/666 |
| 7,960,818 B1* | 6/2011 | Davis | ................ | H01L 23/49503 257/675 |
| 7,989,933 B1* | 8/2011 | Kim | ................... | H01L 23/49503 257/676 |
| 8,053,872 B1* | 11/2011 | Swan | ....................... | C25D 5/12 257/659 |
| 8,648,450 B1* | 2/2014 | Bae | ................... | H01L 23/49541 257/670 |
| 8,736,030 B2 | 5/2014 | Yao et al. | | |
| 8,866,278 B1* | 10/2014 | Bae | ................... | H01L 23/49541 257/676 |
| 9,202,777 B2* | 12/2015 | Tay | ................... | H01L 23/49541 |
| 2004/0080025 A1* | 4/2004 | Kasahara | ............ | H01L 21/4821 257/666 |
| 2009/0065911 A1* | 3/2009 | Wu | ......................... | H01L 23/29 257/666 |

OTHER PUBLICATIONS

Tseng, A.; Lin, M.; Hu, B.; Chen, J.W.; Wan, J.M.; Lee, S.; Yi-Shao Lai, "Advanced QFN Surface Mount Application Notes development," in Electronics Packaging Technology Conference (EPTC), 2010 12th, pp. 737-742, Dec. 8-10, 2010.*

Ramos, Mary Jean, Rico San Antonio, Lynn Guirit, Anang Subagio, and Hadi Handoyo. "The Method of Making Low-cost Multiple-Row QFN." 2007 32nd IEEE/CPMT International Electronic Manufacturing Technology Symposium (2007).*

Lai, Yi-Shao, Pao-Huei Chang-Chien, Chi-Wen Chang, Tsung-Yueh Tsai, Sung-Ching Hung, Andy Tseng, Keiji Takai, and Tetsuyuki Hirashima. "Development and Performance Characterizations of a QFN/HMT Package." 2008 58th Electronic Components and Technology Conference (2008).*

* cited by examiner

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly, to a leadframe-type semiconductor device package and a manufacturing method thereof.

2. Description of the Related Art

Semiconductor dies are conventionally enclosed in plastic packages which provide protection from hostile environments and provide electrical interconnection between a semiconductor die and an underlying substrate such as a printed circuit board (PCB) or motherboard. Such semiconductor package may comprise a metal leadframe having a die pad and a number of leads surrounding the die pad, an integrated circuit or semiconductor die, adhesive material to attach the semiconductor die to the die pad, bonding wires that electrically connect input/output (I/O) pads or contacts on the semiconductor die to individual leads of the leadframe, and a hard plastic encapsulant material which covers the aforesaid components and forms the exterior of the semiconductor package. In addition, such semiconductor package may further include an electrically conductive housing which is grounded and secured to the exterior of the semiconductor package to shield the semiconductor package from electromagnetic interference (EMI).

The leadframe is the central supporting structure of such semiconductor package, and is typically fabricated by chemically etching or mechanically stamping a metal strip. A leadframe package has advantages such as low manufacturing costs, high reliability, and so forth. However, a leadframe package may not satisfy the demands brought on by developments in the field of integrated circuits, which now involve greater numbers of I/O connections and smaller sizes.

Therefore, it would be desirable to develop a semiconductor package capable of reducing the footprint and the package size and has the advantages of lower electric resistance and inductance, and greater electric capacity.

SUMMARY

In accordance with an embodiment of the present disclosure, a semiconductor device package comprises a die pad, a row of leads, a component, a package body, and a conformal shield. The die pad has a top surface. The row of leads comprises a first lead and a second lead, and the row of leads is arranged along a side of the die pad. The first lead has a first lateral surface, and the second lead has a second lateral surface. The component is disposed on the top surface of the die pad. The package body encapsulates the component, the die pad, the first lead, and the second lead, exposes the first lateral surface of the first lead, and covers the second lateral surface of the second lead. The conformal shield covers the package body and connects to the first lateral surface of the first lead.

In accordance with an embodiment of the present disclosure, a semiconductor device package comprises a die pad, a plurality of inner leads, a plurality of outer leads, a package body, and a conformal shield. The inner leads are disposed around the die pad, the outer leads are disposed around the die pad and the inner leads, and each of the outer leads has a lateral surface. The package body encapsulates the die pad, the inner leads, and the outer leads, and exposes the lateral surfaces of the outer leads. The conformal shield covers the package body and connects to the lateral surfaces of the outer leads. A bottom side of the package body defines an opening between the die pad and at least one of the inner leads.

In accordance with an embodiment of the present disclosure, a leadframe comprises a die pad, an outer dambar, a plurality of first leads, a plurality of second leads, and connection members. The outer dambar surrounds the die pad. The first leads are disposed around the die pad and connect to the outer dam bar. The second leads are disposed around the die pad. The connection members connect respective ones of the first leads and the second leads with the die pad. Each of the connection members defines at least one recess.

In accordance with an embodiment of the present disclosure, a method of manufacturing a semiconductor device package comprises (a) providing a strip of leadframes, each leadframe comprising a die pad, an outer dambar surrounding the die pad, a plurality of first leads connected with the outer dambar, a plurality of second leads arranged in at least one row with the first leads, and connection members connecting respective ones of the first leads and the second leads with the die pad, each of the connection members defining at least one recess; (b) attaching a die on the die pad; (c) forming a package body to encapsulate the die, the die pad, the first leads, the second leads, and the outer dambar; (d) removing the connection members between the die pad, the first leads, and the second leads to electrically isolate the first leads and the second leads from the die pad; (e) performing a singulation process on the strip of leadframes to remove the outer dambar and obtain at least one leadframe unit, in which the first leads have lateral surfaces exposed from the package body; and (f) forming a conformal shield covering a top surface and a lateral surface of the package body, and the exposed lateral surfaces of the first leads.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
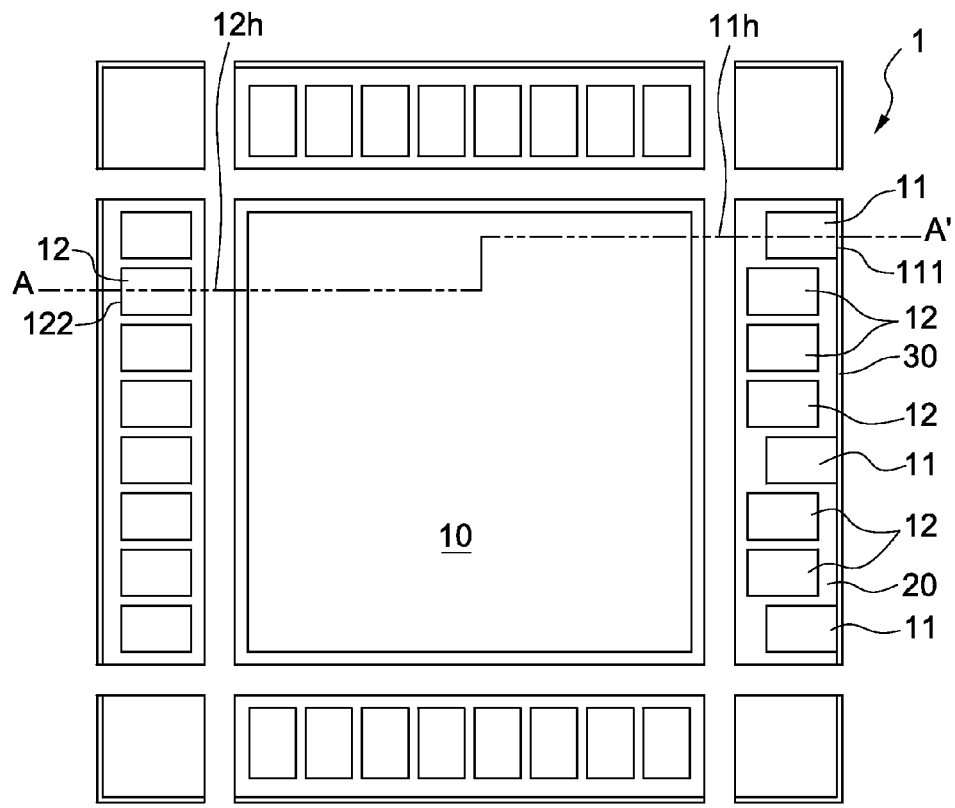
FIG. 1A and FIG. 1B illustrate a semiconductor device package in accordance with an embodiment of the present disclosure.

FIG. 1A illustrates a bottom view of a semiconductor device package 1 in accordance with an embodiment of the present disclosure. The semiconductor device package 1 includes a die pad 10, a plurality of first leads 11, a plurality of second leads 12, a package body 20 and a conformal shield 30.

Referring to the right side of the die pad 10, a row of leads, including the first leads 11, is disposed along the right side of the die pad 10. Each first lead 11 has a lateral surface 111. The lateral surface 111 of each first lead 11 is exposed from the package body 20 and directly contacts the conformal shield 30.

Still referring to the right side of the die pad 10, a number of second leads 12 (e.g., the upper three second leads 12 or the lower two second leads 12 as shown in FIG. 1A) are arranged between every two first leads 11 in the row of leads. A combination of the first leads 11 and second leads 12 are arranged at the right side of the die pad 10. It is contemplated that the structure of the first leads 11 and second leads 12 as well as the layout of the first leads 11 and second leads 12 may be varied in another embodiment of the present disclosure to provide flexibility of the design of the semiconductor device package 1. Each second lead 12 has a lateral surface 122. The lateral surface 122 of the second lead 12 is encapsulated by the package body 20 and is isolated and spaced apart from the conformal shield 30.

Still referring to FIG. 1A, a line or row of second leads 12 are arranged at the left side (as well as the top and bottom sides) of the die pad 10. In accordance with another embodiment of the present disclosure, it is contemplated that a line or row of first leads 11 may be arranged along another side of the die pad 10 in place of, or in addition to, the right side of the die pad 10 (not shown in FIG. 1A).

The conformal shield 30 covers the package body 20 and contacts the lateral surfaces 111 of the first leads 11.

Figure 1B:
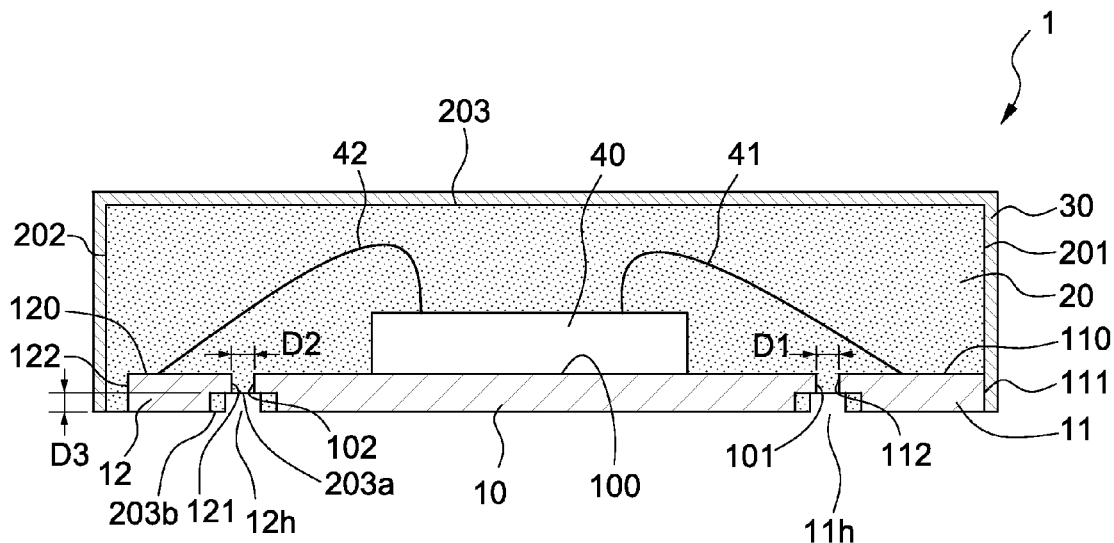

FIG. 1B illustrates a cross-sectional view across line A-A' of FIG. 1A, in accordance with an embodiment of the present disclosure. Although the following discussion refers to a particular first lead 11 and a particular second lead 12, it will be understood that the following discussion is also applicable for other first leads 11 and other second leads 12 of the semiconductor device package 1.

The die pad 10 has a top surface 100, a first lateral surface 101, and a second lateral surface 102 opposite to the first lateral surface 101. The first lateral surface 101 and the second lateral surface 102 are substantially perpendicular to the top surface 100.

The first lead 11 has a top surface 110, a first lateral surface 111, and a second lateral surface 112 opposite to the first lateral surface 111. The first lateral surface 111 and the second lateral surface 112 are substantially perpendicular to the top surface 110. The die pad 10 and the first lead 11 are separated by a distance D1 between the first lateral surface 101 of the die pad 10 and the second lateral surface 112 of the first lead 11.

The second lead 12 has a top surface 120, a first lateral surface 121, and a second lateral surface 122 opposite to the first lateral surface 121. The first lateral surface 121 and the second lateral surface 122 are substantially perpendicular to the top surface 120. The die pad 10 and the second lead 12 are separated by a distance D2 between the second lateral surface 102 of the die pad 10 and the first lateral surface 121 of the second lead 12. The distance D1 is the same or substantially the same as the distance D2 in the illustrated embodiment, although D1 also can be different from D2, such as where D1 is greater than D2, or D2 is greater than D1.

An electrical component 40 is placed on the die pad 10. More specifically, the electrical component 40 is attached to the top surface 100 of the die pad 10. The electrical component 40 may be, for example, a semiconductor die or chip. The electrical component 40 is electrically connected with the first lead 11 through a wire 41 and is electrically connected with the second lead 12 through a wire 42. Each ground output of the electrical component 40 is electrically connected with the first lead 11, and each signal output of the electrical component 40 is electrically connected with the second lead 12.

The package body 20 encapsulates the top surface 100, the first lateral surface 101, and the second lateral surface 102 of the die pad 10, the top surface 110 and the second lateral surface 112 of the first lead 11, the top surface 120, the first lateral surface 121, and the second lateral surface 122 of the second lead 12, the electrical component 40, and the wires 41, 42. The first lateral surface 111 of the first lead 11 is exposed from the package body 20. The exposed first lateral surface 111 of the first lead 11 and a first lateral surface 201 of the package body 20 are substantially coplanar. The package body 20 may include, for example, an epoxy resin having fillers dispersed therein.

At least one first opening 11h of the package body 20 is formed between the first lead 11 and the die pad 10, and at least one second opening 12h of the package body 20 is formed between the second lead 12 and the die pad 10. The first opening 11h and the second opening 12h have substantially the same depth D3, which may be a distance between a first bottom surface 203a of the package body 20 and a second bottom surface 203b of the package body 20. A portion of the first lead 11 and the die pad 10 may be exposed by the first opening 11h, or may remain covered by the package body 20. Similarly, a portion of the second lead 12 and the die pad 10 may be exposed by the second opening 12h, or may remain covered by the package body 20.

The conformal shield 30 is disposed on the package body 20 to cover a top surface 203, the first lateral surface 201, and a second lateral surface 202 of the package body 20, and the exposed first lateral surface 111 of the first lead 11. Accordingly, the exposed first lateral surface 111 of the first lead 11 contacts the conformal shield 30. The second surface 122 of the second lead 12 is spaced apart from the conformal shield 30 by the package body 20, and thus the second lead 12 is electrically isolated from the conformal shield 30. The first lead 11 is a ground lead, and the second lead 12 is a signal lead.

The conformal shield 30 may be deposited as a conductive thin film, and may include, for example, aluminum (Al), copper (Cu), chromium (Cr), tin (Sn), gold (Au), silver (Ag), nickel (Ni), stainless steel, or a mixture, an alloy, or other combination thereof. The conformal shield 30 may include a single conductive layer. In accordance with another embodiment of the present disclosure, the conformal shield 30 may include several conductive layers formed by either the same material or different materials. In some embodiments, each conductive layer may be deposited so as to have a thickness of, for example, up to about 200 μm, up to about 150 μm, up to about 100 μm, up to about 50 μm, up to about 10 μm, up to about 5 μm, up to about 1 μm, or up to about 500 nm, and down to about 100 nm or less, down to about 50 nm or less, or down to about 10 nm or less.

Figure 2A:
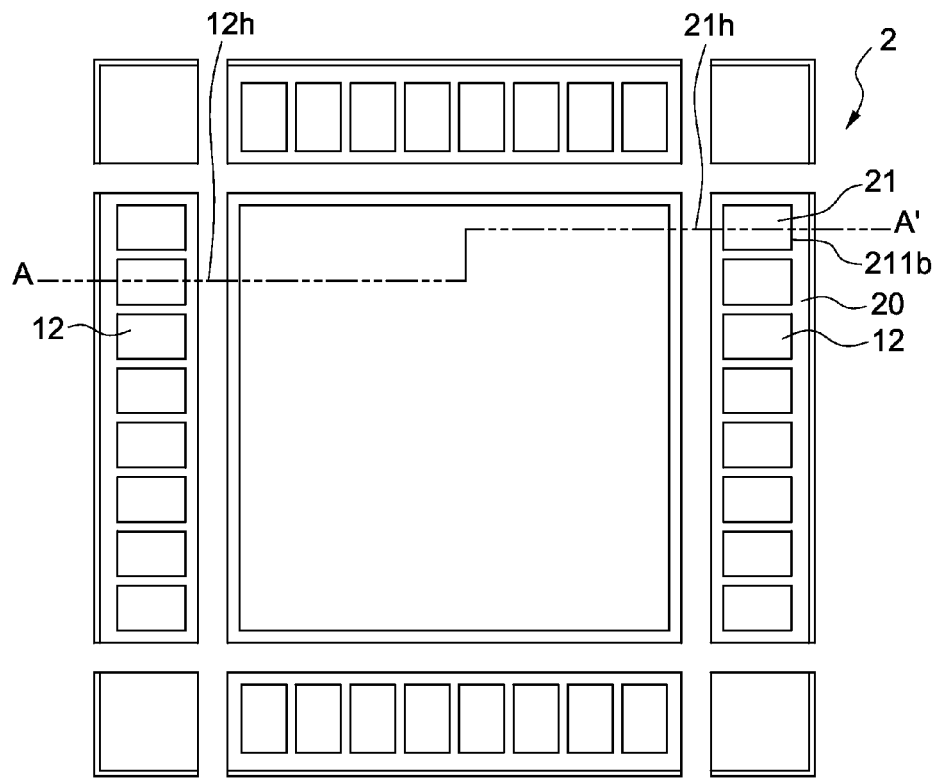
FIG. 2A and FIG. 2B illustrate a semiconductor device package in accordance with another embodiment of the present disclosure.

FIG. 2A illustrates a bottom view of a semiconductor device package 2 in accordance with another embodiment of the present disclosure. The semiconductor device package 2 is similar to the semiconductor device package 1 as illustrated and described with reference to FIG. 1A and FIG. 1B, except that the plurality of first leads 11 are replaced by a plurality of first leads 21, and a lower portion 211b of a lateral surface 211 of each first lead 21 does not contact the conformal shield 30.

Figure 2B:
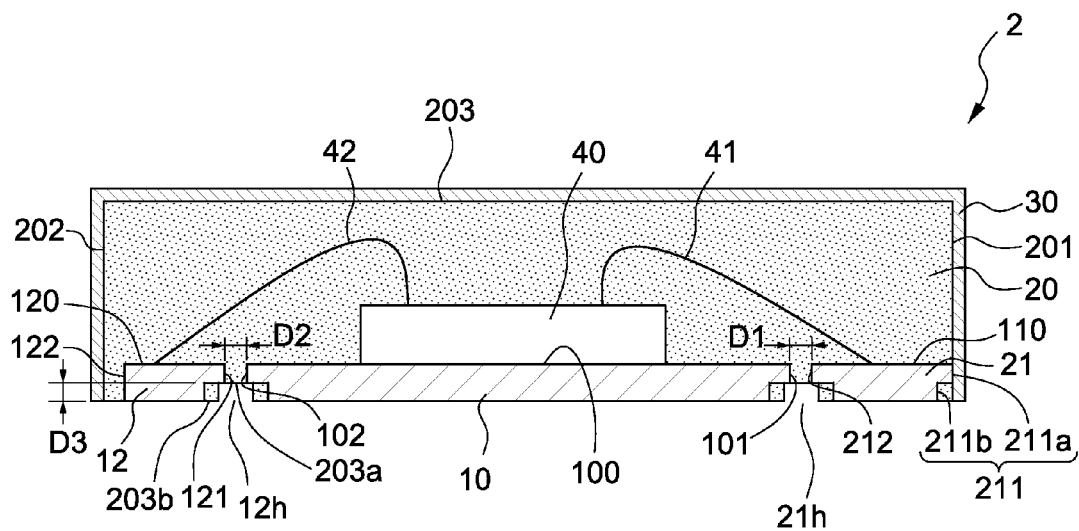

FIG. 2B illustrates a cross-sectional view across line A-A' of FIG. 2A, in accordance with another embodiment of the present disclosure.

Referring to the right side of the die pad 10 in FIG. 2A and FIG. 2B, the first leads 21 are disposed along the right side of the die pad 10. The lateral surface 211 of each first lead 21 has a top portion 211a and a lower portion 211b. The top portion 211a of the lateral surface 211 of the first lead 21 directly contacts the conformal shield 30. The lower portion 211b of the lateral surface 211 of the first lead 21 is encapsulated by the package body 20 and is electrically isolated and spaced apart from the conformal shield 30. That means a mold lock structure is formed between each lower portion 211b of the lateral surface 211 of the first lead 21 and the conformal shield 30 to increase the contact area between the first lead 21 and the package body 20.

Still referring to the right side of the die pad 10 in FIG. 2A and FIG. 2B, a number of second leads 12 are arranged adjacent to at least one first lead 21. A combination of first leads 21 and second leads 12 are arranged at the right side of the die pad 10. It is contemplated that the structure of the first leads 21 and second leads 12 as well as the layout of the first leads 21 and second leads 12 may be varied in another embodiment of the present disclosure to provide flexibility of the design of the semiconductor device package 2. Each second lead 12 has a lateral surface 122. The lateral surface 122 of the second lead 12 is encapsulated by the package body 20 and is isolated and spaced apart from the conformal shield 30.

Still referring to FIG. 2A, a line or row of second leads 12 are arranged at the left side (as well as the top and bottom sides) of the die pad 10. In accordance with another embodiment of the present disclosure, it is contemplated that a line or row of first leads 21 may be arranged along another side of the die pad 10 in place of, or in addition to, the right side of the die pad 10 (not shown in FIG. 2A).

In accordance with an embodiment of the present disclosure, the first leads 11 as shown in FIGS. 1A and 1B may be referred as a "full lead." In accordance with another embodiment of the present disclosure, the first leads 21 as shown in FIGS. 2A and 2B may be referred as a "pull back lead." In accordance with another embodiment of the present disclosure, the semiconductor device package 1 or the semiconductor device package 2 may include both full leads 11 and pull back leads 21.

Figure 3:
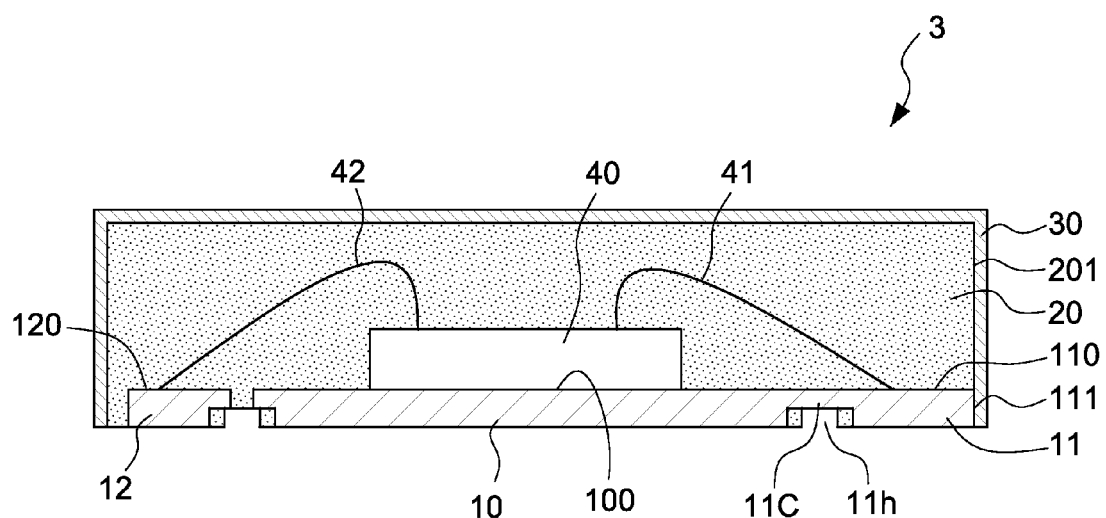
FIG. 3 illustrates a semiconductor device package in accordance with another embodiment of the present disclosure.

FIG. 3 illustrates a semiconductor device package 3 in accordance with another embodiment of the present disclosure. The semiconductor device package 3 is similar to the semiconductor device package 1 as illustrated and described with reference to FIG. 1A and FIG. 1B, except that the first lead 11 and the die pad 10 of the semiconductor device package 3 are electrically connected through a connect portion 11c. In some embodiments, the first lead 11 and the die pad 10 may be formed integrally with the connect portion 11c.

The connect portion 11c is located over the first opening 11h of the package body 20. In one embodiment, the first lead 11 electrically connected with the conformal shield 30 is a ground lead, and thus the connect portion 11c as shown in FIG. 3 may provide greater ground area as compared to the semiconductor device package 1 of FIG. 1B.

Figure 4A:
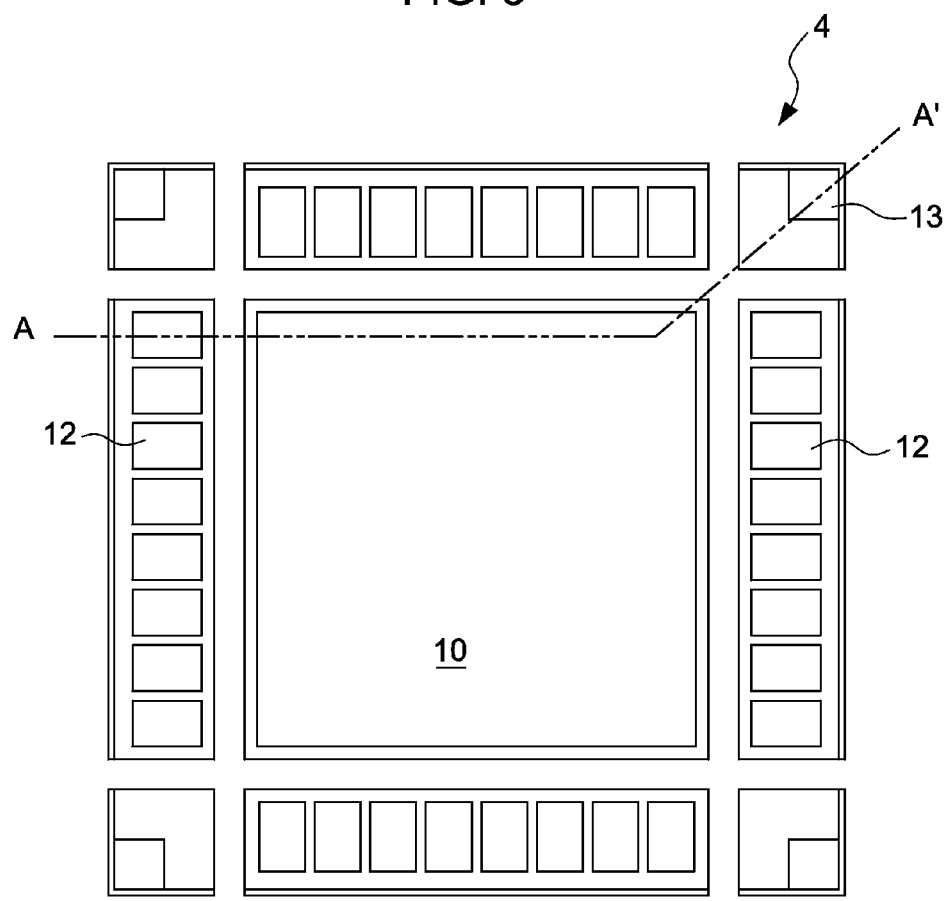
FIG. 4A and FIG. 4B illustrate a semiconductor device package in accordance with another embodiment of the present disclosure.

FIG. 4A illustrates a bottom view of a semiconductor device package 4 in accordance with another embodiment of the present disclosure. The semiconductor device package 4 is similar to the semiconductor device package 1 as illustrated and described with reference to FIG. 1A and FIG. 1B, except that the plurality of first leads 11 as shown in FIG. 1A are replaced by a plurality of second leads 12, and the semiconductor device package 4 further includes a plurality of third leads 13 located at or in the vicinity of corners of the semiconductor device package 4.

Each of the third leads 13 may be connected with the die pad 10 through a tie bar (not shown in FIG. 4A), although the tie bar also may be omitted. Each of the third leads 13 directly contacts the conformal shield 30. The second leads 12 are separated from the conformal shield 30. The third leads 13 are ground leads, and the second leads 12 are signal leads.

Figure 4B:
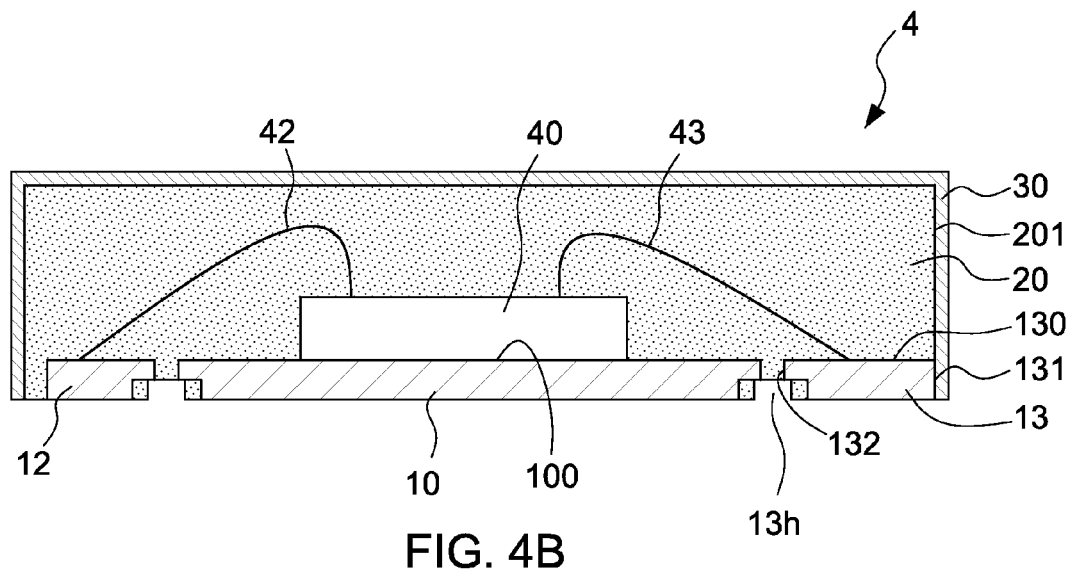

FIG. 4B illustrates a cross-sectional view across line A-A' of FIG. 4A, in accordance with another embodiment of the present disclosure.

The third lead 13 has a top surface 130, a first lateral surface 131, and a second lateral surface 132 opposite to the first lateral surface 131. The first lateral surface 131 and the second lateral surface 132 are substantially perpendicular to the top surface 130. The third lead 13 is separated from the die pad 10 by the package body 20. The first lateral surface 131 of the third lead 13 and the first lateral surface 201 of the package body 20 are substantially coplanar, and thus the first lateral surface 131 of the third lead 13 contacts the conformal shield 30. Each ground output of the electrical component 40 is electrically connected with the third lead 13 through a wire 43, and each signal output of the electrical component 40 is electrically connected with the second lead 12 through the wire 42. At least one third opening 13h of the package body 20 is formed between the third lead 13 and the die pad 10. A portion of the third lead 13 and the die pad 10 may be exposed by the third opening 13h, or may remain covered by the package body 20.

Figure 5A:
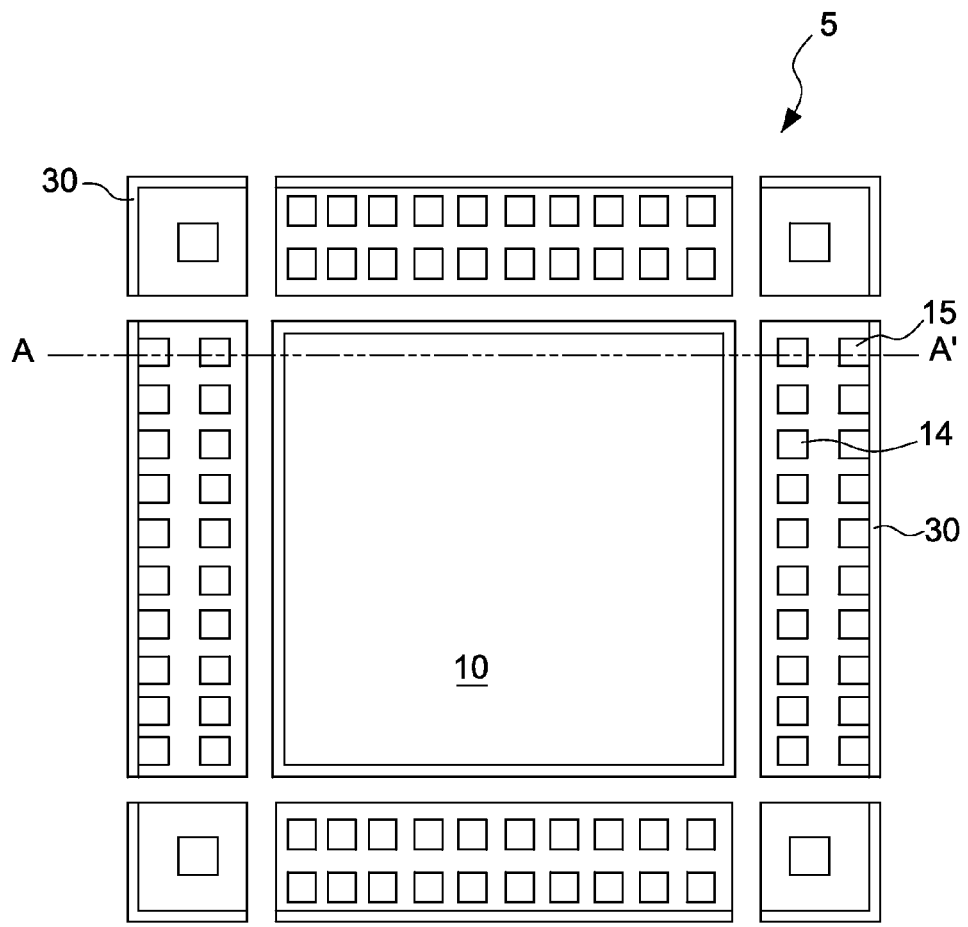
FIG. 5A and FIG. 5B illustrate a semiconductor device package in accordance with another embodiment of the present disclosure.

FIG. 5A illustrates a bottom view of a semiconductor device package 5 in accordance with another embodiment of the present disclosure. The semiconductor device package 5 is similar to the semiconductor device package 4 as illustrated and described with reference to FIG. 4A and FIG. 4B, except that the semiconductor device package 5 includes a dual-row lead structure on each side, namely, inner leads 14 and outer leads 15.

The inner leads 14 and the outer leads 15 are arranged along an edge of the die pad 10. The inner leads 14 are closer to the die pad 10 than the outer leads 15. The outer leads 15 directly contact the conformal shield 30.

Figure 5B:
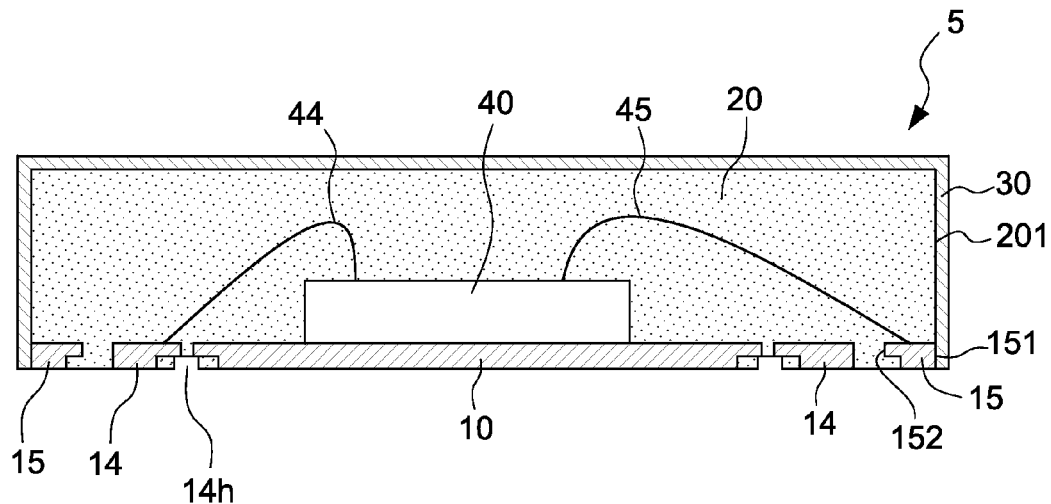

FIG. 5B illustrates a cross-sectional view across line A-A' of FIG. 5A, in accordance with another embodiment of the present disclosure. The inner leads 14 are separated from the die pad 10 and the outer leads 15 by the package body 20. A fourth opening 14h of the package body 20 is formed between each inner lead 14 and the die pad 10. A portion of the inner lead 14 and the die pad 10 may be exposed by the fourth opening 14h, or may remain covered by the package body 20.

The outer lead 15 has a first lateral surface 151 and a second lateral surface 152 opposite to the first lateral surface 151. The second lateral surface 152 of the outer lead 15 faces the inner lead 14. The first lateral surface 151 of the outer lead 15 and the first lateral surface 201 of the package body 20 are substantially coplanar, and thus the first lateral surface 151 of the outer lead 15 contacts the conformal shield 30. Each ground output of the electrical component 40 is electrically connected with the outer lead 15 through a wire 45, and each signal output of the electrical component 40 is electrically connected with the inner lead 14 through a wire 44.

Figure 6A:
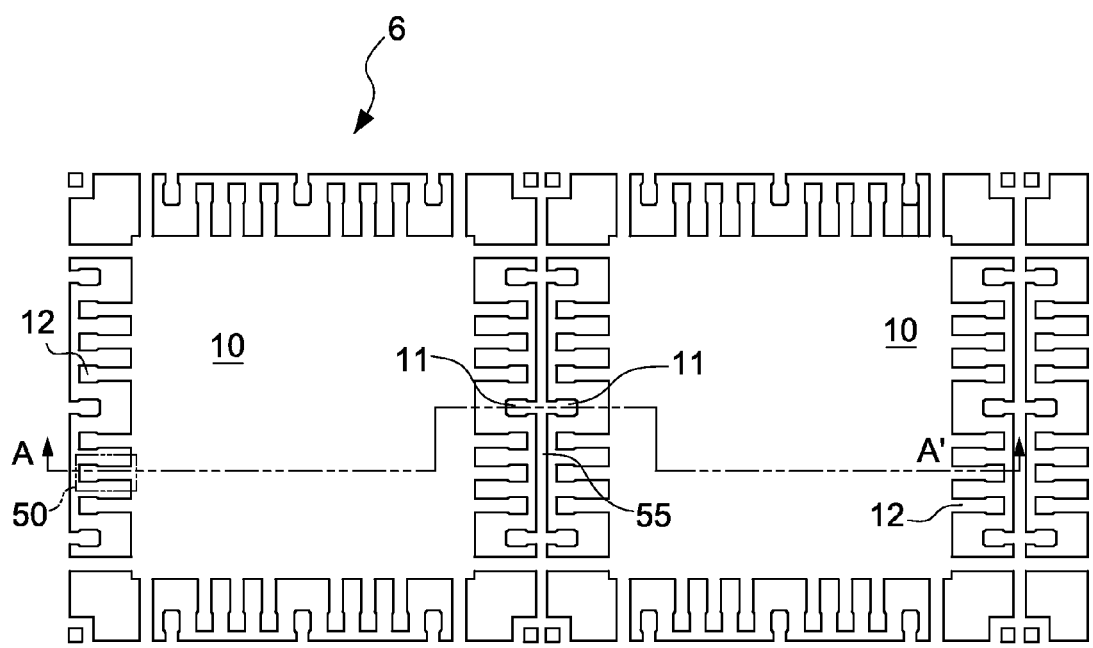
FIG. 6A and FIG. 6B illustrate a leadframe strip in accordance with an embodiment of the present disclosure.

FIG. 6A illustrates a bottom view of a strip of leadframes in accordance with an embodiment of the present disclosure. Each leadframe 6 comprises a die pad 10, an outer dambar 55, a first group of leads 11, and a second group of leads 12.

The outer dambar 55 is arranged to surround the die pad 10 and to connect at least two leadframes 6. In one embodiment, the outer dambar 55 has a generally quadrangular outline or contour.

The die pad 10 has a generally quadrangular (e.g., square) outline or contour. The first leads 11 are arranged around the die pad 10 and are connected to the outer dambar 55. The second leads 12 are arranged around the die pad 10 but are separated from the outer dambar 55.

Figure 6B:
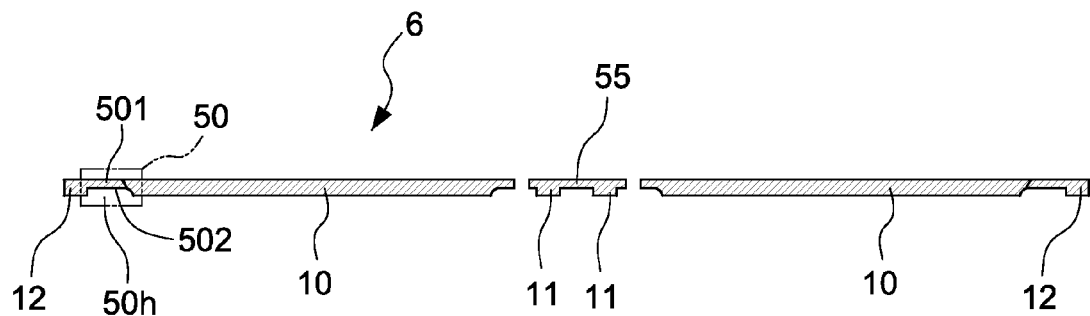

FIG. 6B illustrates a cross-sectional view across line A-A' of FIG. 6A, in accordance with another embodiment of the present disclosure. Each leadframe 6 comprises the die pad 10, the first leads 11, the second leads 12, connection members 50, and an outer dambar 55.

Each connection member 50 has a top surface 501 and a bottom surface 502 opposite to the top surface 501. The connection members 50 respectively connects the second leads 12 with the die pad 10. Each connection member 50 has, or defines, a first recess 50h at a bottom side. The thickness of each first lead 11 and each second lead 12 are substantially the same as that of the die pad 10. The thickness of each first lead 11 and each second lead 12 is greater than that of the connection members 50.

Each leadframe 6 is connected to another leadframe 6 through the outer dambar 55.

Figure 7A:
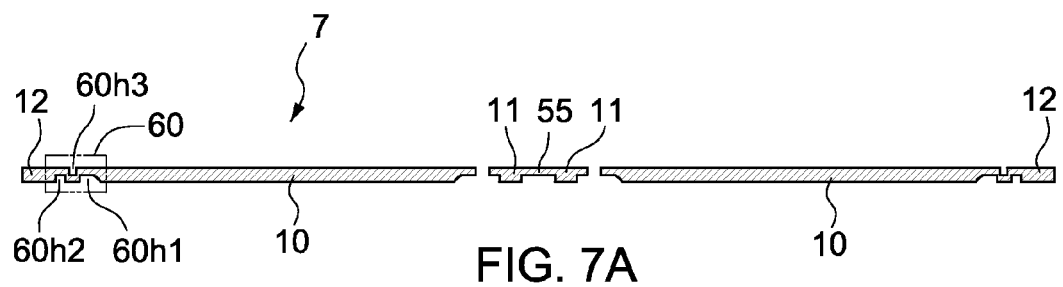
FIG. 7A and FIG. 7B illustrate a leadframe strip in accordance with another embodiment of the present disclosure.

FIG. 7A illustrates a cross-sectional view of a strip of leadframes 7 in accordance with another embodiment of the present disclosure. The leadframe 7 is similar to the leadframe 6 as illustrated and described with reference to FIG. 6A and FIG. 6B, except that each connection member 60 of the leadframe 7 has, or defines, three recesses, namely a first recess 60h1 and a second recess 60h2 at the bottom side and a third recess 60h3 at the top side.

Figure 7B:
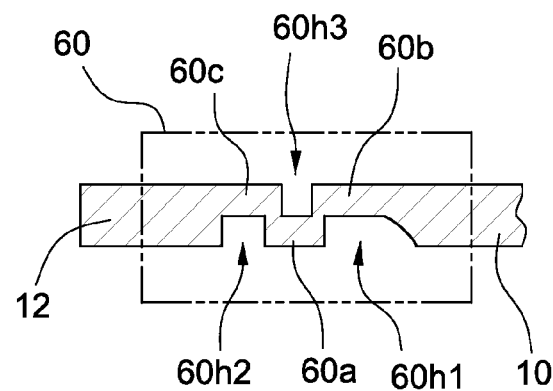

FIG. 7B illustrates an enlarged view of the connection member 60 of FIG. 7A. The connection member 60 comprises a first portion 60a, a second portion 60b, and a third portion 60c. The first recess 60h1 is defined by the first portion 60a, the second portion 60b, and the die pad 10. The second recess 60h2 is defined by the first portion 60a, the third portion 60c, and the lead 11 or 12. The third recess 60h3 is defined by the first portion 60a, the second portion 60b, and the third portion 60c. The third recess 60h3 is located between the first recess 60h1 and the second recess 60h2.

A half cut process may be performed on the connection member 60 of the leadframe unit 7 to remove the first portion 60a of the connection member 60 to respectively separate the lead 11 or 12 from the die pad 10, but the second portion 60b and the third portion 60c of the connection member 60 are still remaining. Accordingly, the structure of the connection member 60 may secure wires connecting the electrical component 40 with the leads 11 and 12 from damage during the half cut process.

FIG. 8A, FIG. 8B, FIG. 8C, FIG. 8D and FIG. 8E illustrate a semiconductor manufacturing process in accordance with an embodiment of the present disclosure.

Figure 8A:
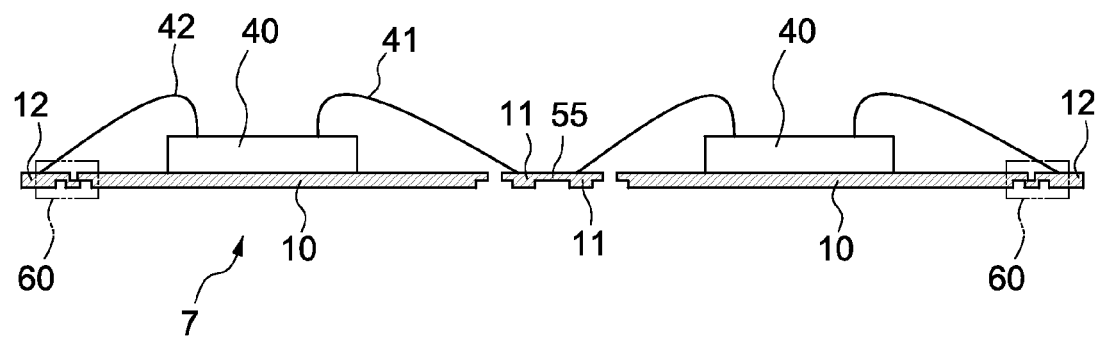
FIG. 8A, FIG. 8B, FIG. 8C, FIG. 8D and FIG. 8E illustrate a manufacturing process in accordance with an embodiment of the present disclosure.

Referring to FIG. 8A, a strip of leadframes 7 is provided. Each leadframe 7 comprises a die pad 10, a plurality of leads 11 and 12 connected with the die pad 10 through connection members 60, and an outer dambar 55. In accordance with another embodiment of the present disclosure, the leadframe 7 may be replaced by the leadframe 6 as shown in FIG. 6B for another design.

An electrical component 40 is placed on the die pad 10. More specifically, the electrical component 40 is attached to a central portion of a top surface of the die pad 10 by a suitable adhesive. The electrical component 40 is respectively connected to the leads 11 and 12 through wires 41, 42 by, for example, a wire bonding technique.

Figure 8B:
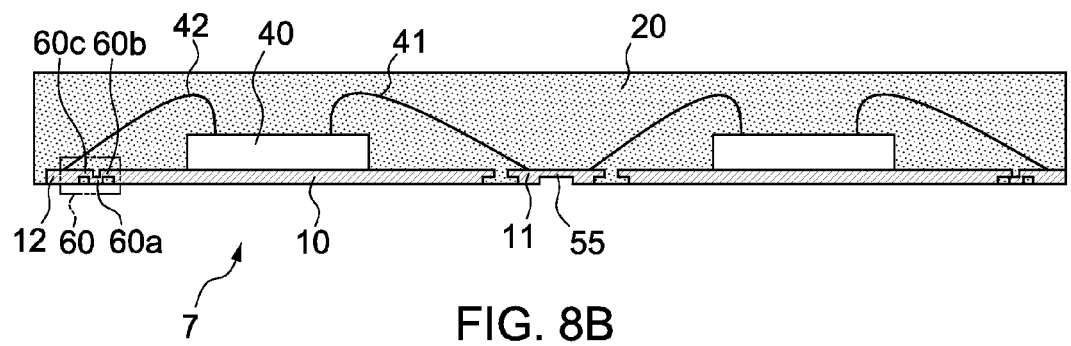

Referring to FIG. 8B, a package body 20 is formed on a top surface of the strip of leadframes 7 to encapsulate the electrical component 40, the wires 41 and 42, the die pad 10, the leads 11 and 12, the outer dambar 55, and the connection members 60. The package body 20 may be formed by a molding technique, such as transfer molding or compression molding.

Figure 8C:
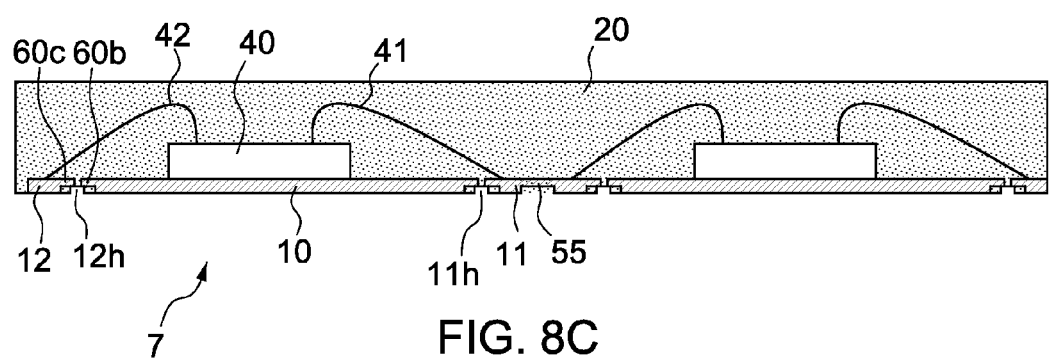

Referring to FIG. 8C, a first portion 60a of each connection member 60 between the die pad 10 and the lead 12 is removed to electrically isolate the leads 12 from the die pad 10, and a portion of the package body 20 between the die pad 10 and the lead 11 is removed. A first opening 11h and a second opining 12h are formed respectively subsequent to the removal of the portion of the package body 20 and the first portions 60a of the connection members 60. The first portion 60a of each connection member 60 is removed by cutting off the first portion 60a but leaving the second portion 60b and the third portion 60c substantially intact. The first portion 60a of the connection member 60 can be removed by, for example, a half cut process. In the embodiment, the half cutting may be performed on each connection member 60 of the leadframe 7 from the first portion 60a to the third recess 60h3. The first portions 60a of the connection members 60 are removed to separate the leads 11 and 12 from the die pad 10, and the second portions 60b and the third portions 60c of the connection members 60 remain. Accordingly, the structure of the connection members 60 may secure the wires 41 and 42 connecting the electrical component 40 with the leads 11 and 12 from damage during the half cut process.

In accordance with another embodiment of the present disclosure, the connection member 60 can be removed, for example, where the first portion 60a, the second portion 60b, and the third portion 60c are removed by a cutting technique.

Figure 8D:
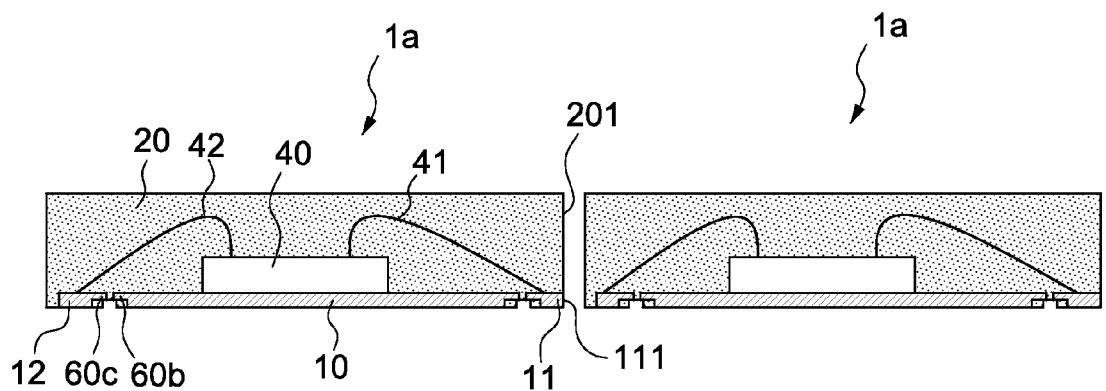

Referring to FIG. 8D, a singulation process is performed on the encapsulated strip of leadframes 7 by removing the outer dambar 55 and a part of the package body 20 to obtain a number of leadframe units 1a. The outer dambar 55 and the part of the package body 20 can be removed by, for example, a full cut process, for example, where a cutting process performed from the bottom surface of the package body 20 to the top surface of the package body 20 along a scribe line (not shown in FIG. 8D). The singulation process is performed by using laser or other appropriate cutting technique.

After the singulation process, a lateral surface 111 of the lead 11 is exposed from the package body 20. In other words, the lateral surface 111 of the lead 11 is substantially coplanar with a lateral surface 201 of the package body 20.

Figure 8E:
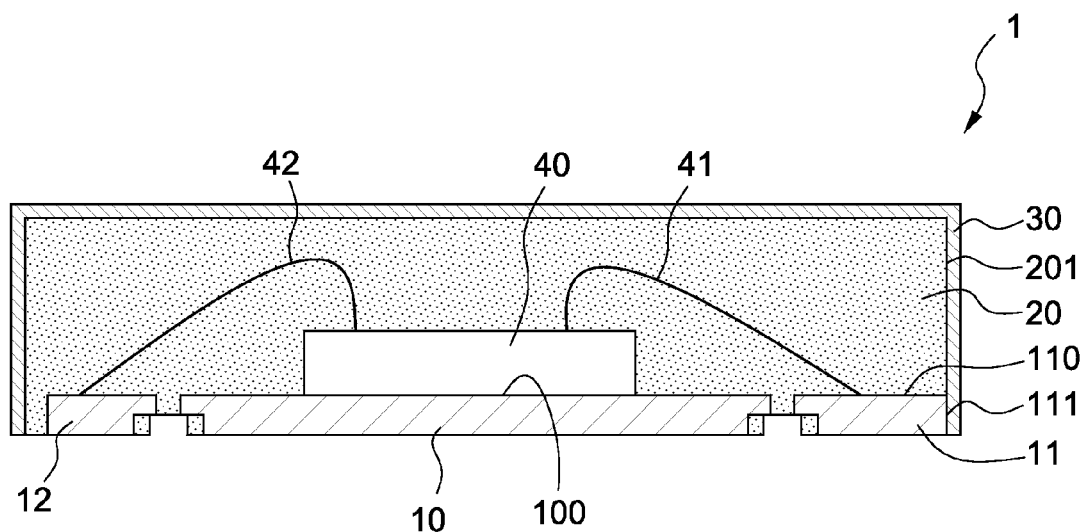

Referring to FIG. 8E, a conformal shield 30 is formed on an outer surface of the package body 20 to form the semiconductor package structure 1 as shown in FIG. 1B. The conformal shield 30 covers a top surface and a lateral surface of the package body 20 and the exposed lateral surface 111 of the lead 11. Therefore, the lateral surface 111 of the lead 11 contacts the conformal shield 30. Since the lateral surface 122 of the lead 12 (shown in FIG. 1B) is encapsulated by the package body 20, the lead 12 is separated from the conformal shield 30. The conformal shield 30 can be formed by, for example, a plating or spray application process followed by a drying process.

FIG. 9A, FIG. 9B, FIG. 9C, FIG. 9D and FIG. 9E illustrate a semiconductor manufacturing process in accordance with another embodiment of the present disclosure.

Figure 9A:
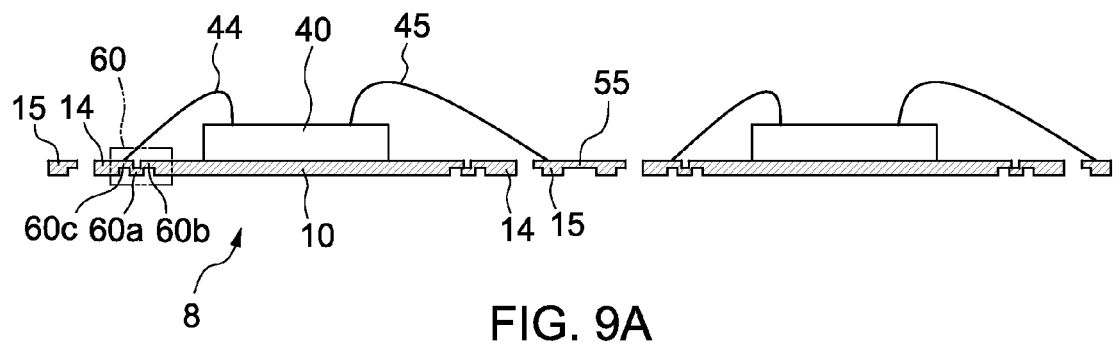
FIG. 9A, FIG. 9B, FIG. 9C, FIG. 9D and FIG. 9E illustrate a manufacturing process in accordance with another embodiment of the present disclosure.

Referring to FIG. 9A, a strip of leadframes 8 is provided. The leadframe 8 is similar to the leadframe 7 as described and illustrated with reference to FIG. 7A, except that the leadframe 8 comprises a plurality of inner leads 14 connected to the die pad 10 by respective connection members 60, and also comprises a plurality of outer leads 15 connected to the outer dambar 55. The inner leads 14 are isolated from the outer leads 15.

An electrical component 40 is placed on the die pad 10. More specifically, the electrical component 40 is attached to a central portion of a top surface of the die pad 10 by using a suitable adhesive. The electrical component 40 is connected to the inner leads 14 through the wires 44 and connected to the outer leads 15 through the wires 45.

Figure 9B:
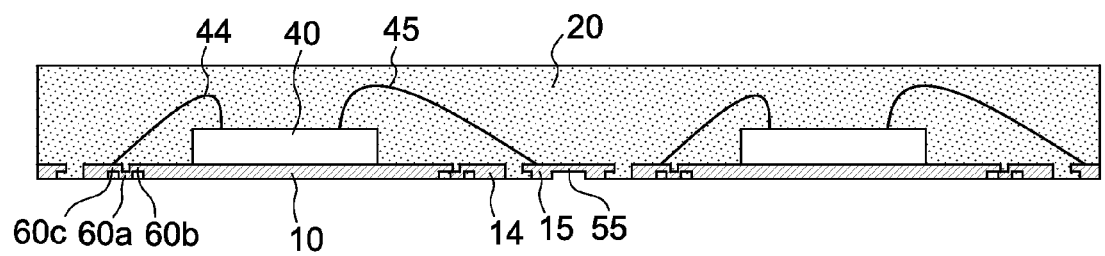

Referring to FIG. 9B, a package body 20 is formed on a top surface of the strip of leadframes 8 to encapsulate the electrical component 40, the wires 44 and 45, the die pad 10, the inner leads 14, the outer leads 15, the outer dambar 55, and the connection members 60. The package body 20 may be formed by a molding technique, such as transfer molding or compression molding.

Figure 9C:
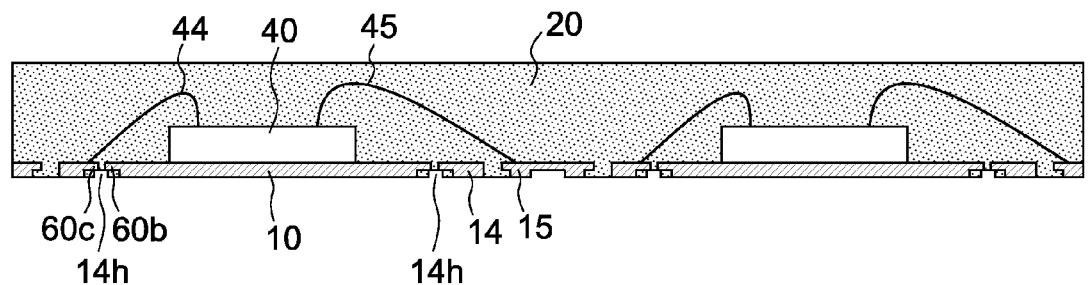

Referring to FIG. 9C, a first portion 60a of each connection member 60 between the die pad 10 and the inner leads 14 is removed, and an opening 14h is formed in order to separate each inner lead 14 from the die pad 10. Each connection member 60 is removed by cutting off the first portion 60a of the connection member 60 and leaving the second portion 60b and the third portion 60c substantially intact. The first portion 60a of the connection member 60 can be removed by, for example, a half cut process. The depth of the opening 14h is controlled to be less than the thickness of the die pad 10 and the inner lead 14 to secure wires connecting the electrical component 40 with the inner lead 14 and the outer lead 15 from damage during the half cut process and to increase the mold lock strength of the package body 20, the die pad 10, and the inner lead 14. In another embodiment, the connection member 60 can be removed, for example, by cutting off the first portion 60a, the second portion 60b, and the third portion 60c.

Figure 9D:
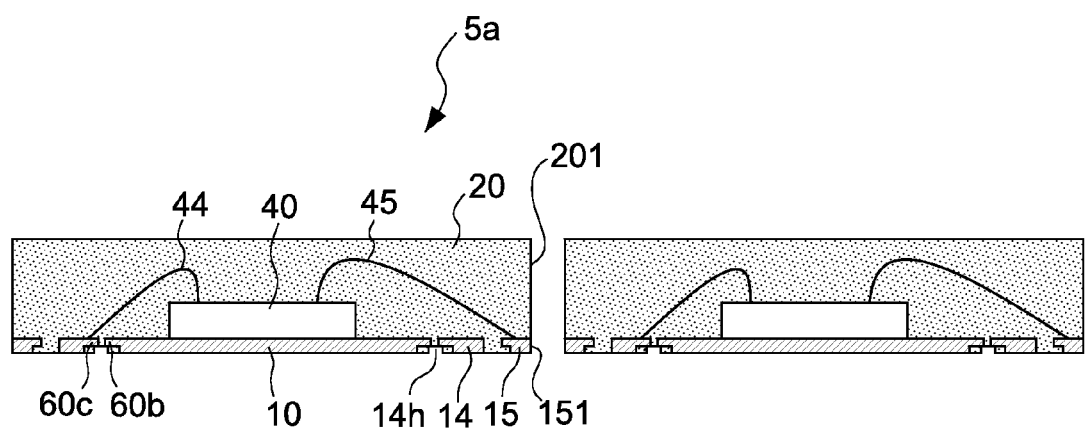

Referring to FIG. 9D, a singulation process is performed on the encapsulated strip of leadframes 8 by removing the outer dambar 55 and a part of the package body 20 to obtain a number of leadframe units 5a. The outer dambar 55 and the part of the package body 20 can be removed by, for example, a full cut process. The singulation process is performed by using a laser or other appropriate cutting tool.

After the singulation process, a lateral surface 151 of each outer lead 15 is exposed from the package body 20. In other words, the lateral surface 151 of each outer lead 15 is substantially coplanar with a lateral surface 201 of the package body 20.

Figure 9E:
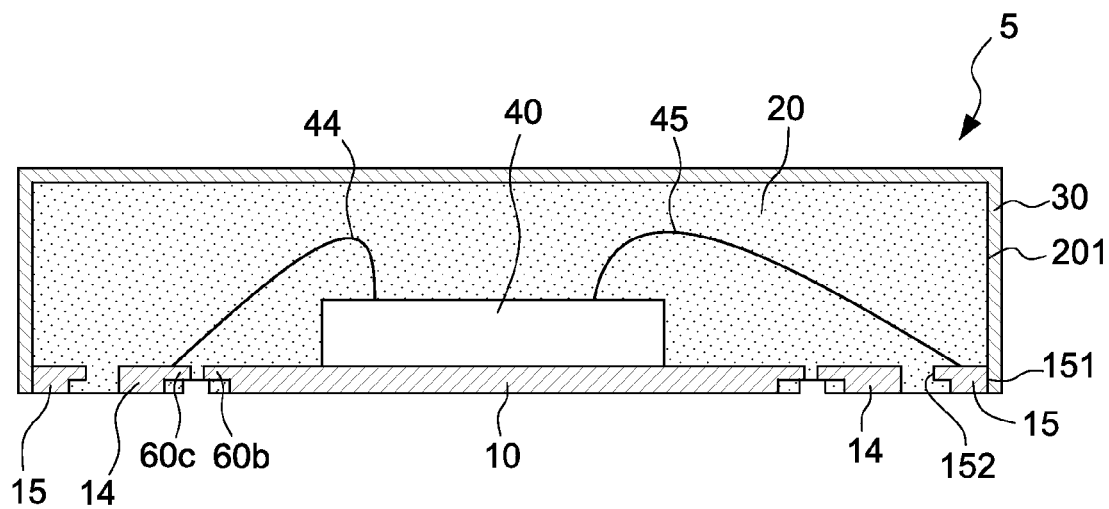

Referring to FIG. 9E, a conformal shield 30 is formed on an outer surface of the package body 20 in order to form the semiconductor package structure 5 as shown in FIG. 5B. The conformal shield 30 covers a top surface and a lateral surface of the package body 20, and the exposed lateral surface 151 of the outer lead 15. Therefore, the lateral surface 151 of the outer lead 15 contacts the conformal shield 30. The conformal shield 30 can be formed by, for example, a plating or spray application process followed by a drying process. In another embodiment, the leadframe 8 may have a structure similar to the leadframe 6 as described and illustrated with reference to FIG. 6B.

As used herein, the terms "substantially," "substantial," "approximately," and "about" are used to denote small variations. When used in conjunction with an event or circumstance, the terms can refer to instances in which the event or circumstance occurs precisely, as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Two surfaces can be deemed to be perpendicular or substantially perpendicular if an angle between the surfaces is, for example, 90°±10°, such as ±5°, ±4°, ±3°, ±2°, ±1°, ±0.5°, ±0.1°, or ±0.05°. Two surfaces can be deemed to be coplanar or substantially coplanar if a displacement between the two surfaces is, for example, no greater than 1 µm, no greater than 0.5 µm, or no greater than 0.2 µm. Two depths or other values can be deemed to be equal or substantially equal if a difference between a larger one of the values and a smaller one of the values is less than or equal to ±10% of the smaller value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It can be understood that such range formats are used for convenience and brevity, and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising
a die pad having a top surface;
a row of leads comprising a first lead and a second lead, the row of leads being arranged along a side of the die pad, wherein the first lead has a first lateral surface, and the second lead has a second lateral surface;
a component disposed on the top surface of the die pad;
a package body encapsulating the component, the die pad, the first lead, and the second lead, the package body exposing the first lateral surface of the first lead and covering the second lateral surface of the second lead; and
a conformal shield covering the package body and connected to the first lateral surface of the first lead.

2. The semiconductor device package of claim 1, wherein a distance between the first lead and the die pad is different from a distance between the second lead and the die pad.

3. The semiconductor device package of claim 1, wherein a distance between the first lead and the die pad is substantially the same as a distance between the second lead and the die pad.

4. The semiconductor device package of claim 1, wherein a bottom side of the package body defines an opening between the die pad and the second lead.

5. The semiconductor device package of claim 4, wherein the package body has a first bottom surface and a second bottom surface, and a distance between the first bottom surface and the second bottom surface is a depth of the opening.

6. The semiconductor device package of claim 1, wherein a portion of the first lateral surface of the first lead is covered by the package body, and another portion of the first lateral surface of the first lead is exposed by the package body.

7. The semiconductor device package of claim 1, wherein the second lead is separated from the conformal shield and the die pad by the package body.

8. The semiconductor device package of claim 1, wherein the first lateral surface of the first lead and a lateral surface of the package body are substantially coplanar.

9. The semiconductor device package of claim 1, wherein the first lead is a ground lead.

10. A semiconductor device package, comprising
a die pad;
a plurality of inner leads disposed around the die pad;
a plurality of outer leads disposed around the die pad and the inner leads, wherein each of the outer leads has a lateral surface;
a package body encapsulating the die pad, the inner leads, and the outer leads, the package body exposing the lateral surface of each of the outer leads; and
a conformal shield covering the package body and connected to the lateral surfaces of the outer leads,
wherein the package body defines an opening between the die pad and at least one of the inner leads, the opening extending from a first bottom surface of the package body to a second bottom surface of the package body, and the first bottom surface and the second surface of the package body are non-coplanar;
wherein the opening exposes, at the first bottom surface of the package body, a portion of the die pad and a portion of the at least one of the inner leads.

11. The semiconductor device package of claim 10, wherein a depth of the opening is less than a thickness of the die pad.

12. The semiconductor device package of claim 10, further comprising a component disposed on the die pad, and signal outputs of the component are connected to the inner leads, and ground outputs of the component are connected to the outer leads.

13. A method of manufacturing a semiconductor device package, comprising
(a) providing a strip of leadframes, each leadframe comprising a die pad, an outer dambar surrounding the die pad, a plurality of first leads connected with the outer dambar, a plurality of second leads arranged in at least one row with the first leads, and connection members connecting respective ones of the first leads and the second leads with the die pad, each of the connection members defining at least one recess;
(b) attaching a die on the die pad;
(c) forming a package body to encapsulate the die, the die pad, the first leads, the second leads, and the outer dambar;
(d) removing the connection members between the die pad, the first leads, and the second leads to electrically isolate the first leads and the second leads from the die pad;
(e) performing a singulation process on the strip of leadframes to remove the outer dambar and obtain at least one leadframe unit, in which the first leads have lateral surfaces exposed from the package body and the second leads are covered by the package body; and
(f) forming a conformal shield covering a top surface and a lateral surface of the package body, and the exposed lateral surfaces of the first leads.

14. The method of claim 13, wherein in (c), the package body is formed to cover a lateral surface of each second lead.

15. The method of claim 13, wherein each connection member comprises a first portion, a second portion, and a third portion, the third portion connects to one of the first leads and the second leads, the second portion connects to the die pad, and the first portion connects the second portion to the third portion, wherein in (d), at least a part of the first portion is removed.

16. The method of claim 13, wherein in (c), the at least one recess is filled with the package body.

* * * * *